United States Patent
Wang et al.

(10) Patent No.: US 10,707,879 B2
(45) Date of Patent: Jul. 7, 2020

(54) FREQUENCY-MODULATED CONTINUOUS-WAVE RADAR SYSTEM AND FREQUENCY TRACKING METHOD FOR CALIBRATING FREQUENCY GAINS OF A RADIO FREQUENCY SIGNAL TO APPROACH WIDEBAND FLATNESS FREQUENCY RESPONSES

(71) Applicant: KaiKuTek INC., Taipei (TW)

(72) Inventors: Mike Chun Hung Wang, Taipei (TW); Pang-Ning Chen, Taipei (TW); Chen-Lun Lin, Hsinchu (TW); Ying-Chia Chen, Taoyuan (TW); Wei-Jyun Wang, Kaohsiung (TW)

(73) Assignee: KaiKuTek INC., Taipei (TW)

( * ) Notice: Subject to any disclaimer, the term of this patent is extended or adjusted under 35 U.S.C. 154(b) by 248 days.

(21) Appl. No.: 16/030,829

(22) Filed: Jul. 9, 2018

(65) Prior Publication Data
US 2019/0317189 A1     Oct. 17, 2019

Related U.S. Application Data

(60) Provisional application No. 62/656,999, filed on Apr. 13, 2018.

(51) Int. Cl.
*H03L 7/089*     (2006.01)
*H03L 7/081*     (2006.01)
(Continued)

(52) U.S. Cl.
CPC ............ *H03L 7/0891* (2013.01); *G01S 7/352* (2013.01); *G01S 7/40* (2013.01); *G01S 7/4021* (2013.01);
(Continued)

(58) Field of Classification Search
CPC ... H03L 7/0891; H03L 7/0816; H03L 7/0818; H03L 7/099; H03L 7/16; G01S 7/40;
(Continued)

(56) References Cited

U.S. PATENT DOCUMENTS

| | | | | |
|---|---|---|---|---|
| 7,557,664 B1 * | 7/2009 | Wu | .................. | H03N 19/14 327/115 |
| 7,710,210 B2 * | 5/2010 | Casper | ............ | G01R 31/31726 327/311 |

(Continued)

*Primary Examiner* — Vladimir Magloire
*Assistant Examiner* — Monark Sharma
(74) *Attorney, Agent, or Firm* — Winston Hsu (57) ABSTRACT

A frequency-modulated continuous-wave radar system includes a waveform generator, a delta-sigma modulation circuit, a voltage controlled oscillator, a frequency divider circuit, a control circuit, an injection locked oscillator, a power amplifier circuit, a first power detection circuit, a second power detection circuit, a third power detection circuit, and a calibration engine circuit. The waveform generator, the delta-sigma modulation circuit, the voltage controlled oscillator, the frequency divider circuit, and the control circuit form a phase locked loop. The calibration engine circuit is coupled to the delta-sigma modulation circuit, the voltage controlled oscillator, the injection locked oscillator, the power amplifier circuit, the first power detection circuit, the second power detection circuit, and the third power detection circuit for adjusting frequency gains of the voltage controlled oscillator, the injection locked oscillator, and the power amplifier circuit to approach wideband flatness frequency responses.

20 Claims, 6 Drawing Sheets

(51) Int. Cl.

| | |
|---|---|
| *H03L 7/16* | (2006.01) |
| *G01S 7/35* | (2006.01) |
| *G01S 7/40* | (2006.01) |
| *G01S 13/34* | (2006.01) |
| *H03B 5/04* | (2006.01) |
| *H03B 5/12* | (2006.01) |
| *H03H 7/06* | (2006.01) |
| *H03L 7/099* | (2006.01) |
| *H03F 1/32* | (2006.01) |
| *H03F 3/19* | (2006.01) |
| *H03F 3/45* | (2006.01) |
| *H04B 1/18* | (2006.01) |
| *H03F 1/02* | (2006.01) |
| *H03F 3/10* | (2006.01) |

(52) U.S. Cl.
CPC .............. *G01S 13/343* (2013.01); *H03B 5/04* (2013.01); *H03B 5/1215* (2013.01); *H03F 1/0205* (2013.01); *H03F 1/32* (2013.01); *H03F 3/10* (2013.01); *H03F 3/19* (2013.01); *H03F 3/45475* (2013.01); *H03F 3/45636* (2013.01); *H03H 7/06* (2013.01); *H03L 7/0816* (2013.01); *H03L 7/0818* (2013.01); *H03L 7/099* (2013.01); *H03L 7/16* (2013.01); *H04B 1/18* (2013.01); *H03B 2200/004* (2013.01); *H03B 2200/0074* (2013.01); *H03B 2201/0208* (2013.01); *H03F 2200/222* (2013.01); *H03F 2200/451* (2013.01); *H03F 2200/513* (2013.01); *H03F 2203/45156* (2013.01); *H03F 2203/45544* (2013.01); *H03F 2203/45631* (2013.01)

(58) Field of Classification Search
CPC ....... G01S 7/4021; G01S 13/343; H03B 5/04; H03B 5/1215; H04B 1/18; H03F 1/0205; H03F 1/32; H03F 3/10; H03F 3/19; H03F 3/45475; H03F 3/45636; H03H 7/06
USPC ........ 342/103, 101, 102, 104; 331/109, 115, 331/132, 182, 183
See application file for complete search history.

(56) References Cited

U.S. PATENT DOCUMENTS

| | | | |
|---|---|---|---|
| 2012/0274409 A1* | 11/2012 | Eldesouki | H03C 1/52 331/109 |
| 2014/0072077 A1* | 3/2014 | Cheng | H04L 27/12 375/303 |
| 2015/0200627 A1* | 7/2015 | Valdes-Garcia | H03B 5/1228 331/8 |
| 2019/0280709 A1* | 9/2019 | Bashir | H03M 3/458 |

\* cited by examiner

FREQUENCY-MODULATED CONTINUOUS-WAVE RADAR SYSTEM AND FREQUENCY TRACKING METHOD FOR CALIBRATING FREQUENCY GAINS OF A RADIO FREQUENCY SIGNAL TO APPROACH WIDEBAND FLATNESS FREQUENCY RESPONSES

CROSS REFERENCE TO RELATED APPLICATIONS

This application claims the benefit of U.S. provisional application No. 62/656,999, filed Apr. 13, 2018.

BACKGROUND OF THE INVENTION

1. Field of the Invention

The present invention illustrates a frequency-modulated continuous-wave radar system and a frequency tracking method, and more particularly, the frequency-modulated continuous-wave radar system and the frequency tracking method for calibrating frequency gains of a radio frequency signal to approach wideband flatness frequency responses.

2. Description of the Prior Art

With advancement of technologies and networks, several radio frequency (RF) broadcasting technologies are applied to wireless communications. For example, a frequency-modulated continuous-wave radar (FMCW radar) is a special type of radar system which radiates continuous transmission power with a varied frequency. The FMCW radar can change its operating frequency over time. In other words, a transmitted signal can be modulated in frequency (or in phase). The FMCW radar can be used for estimating scales or distances by measuring differences in phase or in frequency between an actually transmitted signal and a received signal. Several advantages of the FMCW radar can be apparently obtained so that the FMCW radar takes more attention in recent years. First, the FMCW radar can measure a very small scale range of the target (i.e., a minimal measured range is comparable to the transmitted wavelength). Particularly, the FMCW radar can work in Milli-meter-Wave (MMW) region with high frequency, low wavelength, and high resolution. Further, MMW is capable of penetrating a variety of non-metallic materials so that it can provide reliable communications. Second, the FMCW radar can measure the target range and its relative velocity simultaneously. Third, the FMCW radar has very high accuracy of range measurement. Generally, an FMCW transceiver requires wide bandwidth for achieving high resolution.

However, conventional FMCW radar with an ultra-wide-band transceiver requires an oscillator operated under a wide bandwidth, a power amplifier operated under the wide bandwidth, and a low noise amplifier operated under the wide bandwidth. Particularly, when the oscillator, the power amplifier, and the low noise amplifier requires to process signals with the wide bandwidth, a trade-off problem between power consumption and communication efficiency occurs. In other words, when the transceiver of the FMCW radar is designed as the ultra-wide-band transceiver, power consumption and hardware complexity are increased.

SUMMARY OF THE INVENTION

In an embodiment of the present invention, a frequency-modulated continuous-wave radar system is disclosed. The system comprises a waveform generator, a delta-sigma modulation circuit, a voltage controlled oscillator, a frequency divider circuit, a control circuit, an injection locked oscillator, a power amplifier circuit, a first power detection circuit, a second power detection circuit, a third power detection circuit, and a calibration engine circuit. The waveform generator is configured to generate a modulation pattern signal. The delta-sigma modulation circuit is coupled to the waveform generator and configured to modulate the modulation pattern signal for outputting a delta-sigma modulation signal. The voltage controlled oscillator is coupled to the waveform generator and configured to output a first frequency signal. The frequency divider circuit is coupled to the delta-sigma modulation circuit and the voltage controlled oscillator and configured to convert the first frequency signal to a feedback low frequency signal according to the delta-sigma modulation signal. The control circuit is coupled to the voltage controlled oscillator and the frequency divider circuit and configured to control linearity of the voltage controlled oscillator according to the feedback low frequency signal. The injection locked oscillator is coupled to the voltage controlled oscillator and the waveform generator and configured to convert the first frequency signal to a second frequency signal according to the modulation pattern signal. The power amplifier circuit is coupled to the injection locked oscillator and the waveform generator and configured to amplify the second frequency signal in order to generate a radio frequency signal according to the modulation pattern signal. The first power detection circuit is coupled to voltage controlled oscillator and configured to detect a peak power of the first frequency signal. The second power detection circuit is coupled to the injection locked oscillator and configured to detect a peak power of the second frequency signal. The third power detection circuit is coupled to the power amplifier circuit and configured to detect a peak power of the radio frequency signal. The calibration engine circuit is coupled to the delta-sigma modulation circuit, the voltage controlled oscillator, the injection locked oscillator, the power amplifier circuit, the first power detection circuit, the second power detection circuit, and the third power detection circuit and configured to adjust frequency gains of the voltage controlled oscillator, the injection locked oscillator, and the power amplifier circuit to approach wideband flatness frequency responses according to peak powers of the first frequency signal, the second frequency signal, and the radio frequency signal. The first frequency signal has a first frequency. The second frequency signal has a second frequency. The second frequency is greater than the first frequency.

In an embodiment of the present invention, a frequency tracking method for calibrating frequency gains of a radio frequency signal to approach wideband flatness frequency responses is disclosed. The method comprises generating a modulation pattern signal by a waveform generator, generating a first frequency signal by a voltage controlled oscillator according to the modulation pattern signal, stabilizing frequency linearity of the voltage controlled oscillator by using a phase-locked loop with a varied divider ratio N, wherein N a positive integer, detecting a peak power of the first frequency signal, converting the first frequency signal to a second frequency signal by using an injection locked oscillator according to the modulation pattern signal, detecting a peak power of the second frequency signal, amplifying the second frequency signal to generate a radio frequency signal by using a power amplifier circuit according to the modulation pattern signal, detecting a peak power of the radio frequency signal, adjusting frequency gains of the voltage controlled oscillator according to the peak power of the first frequency signal, adjusting frequency gains of the injection locked oscillator according to the peak power of the second frequency signal, and adjusting frequency gains of the power amplifier circuit according to the peak power of the radio frequency signal. The first frequency signal has a first frequency. The second frequency signal has a second frequency. The second frequency is greater than the first frequency.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
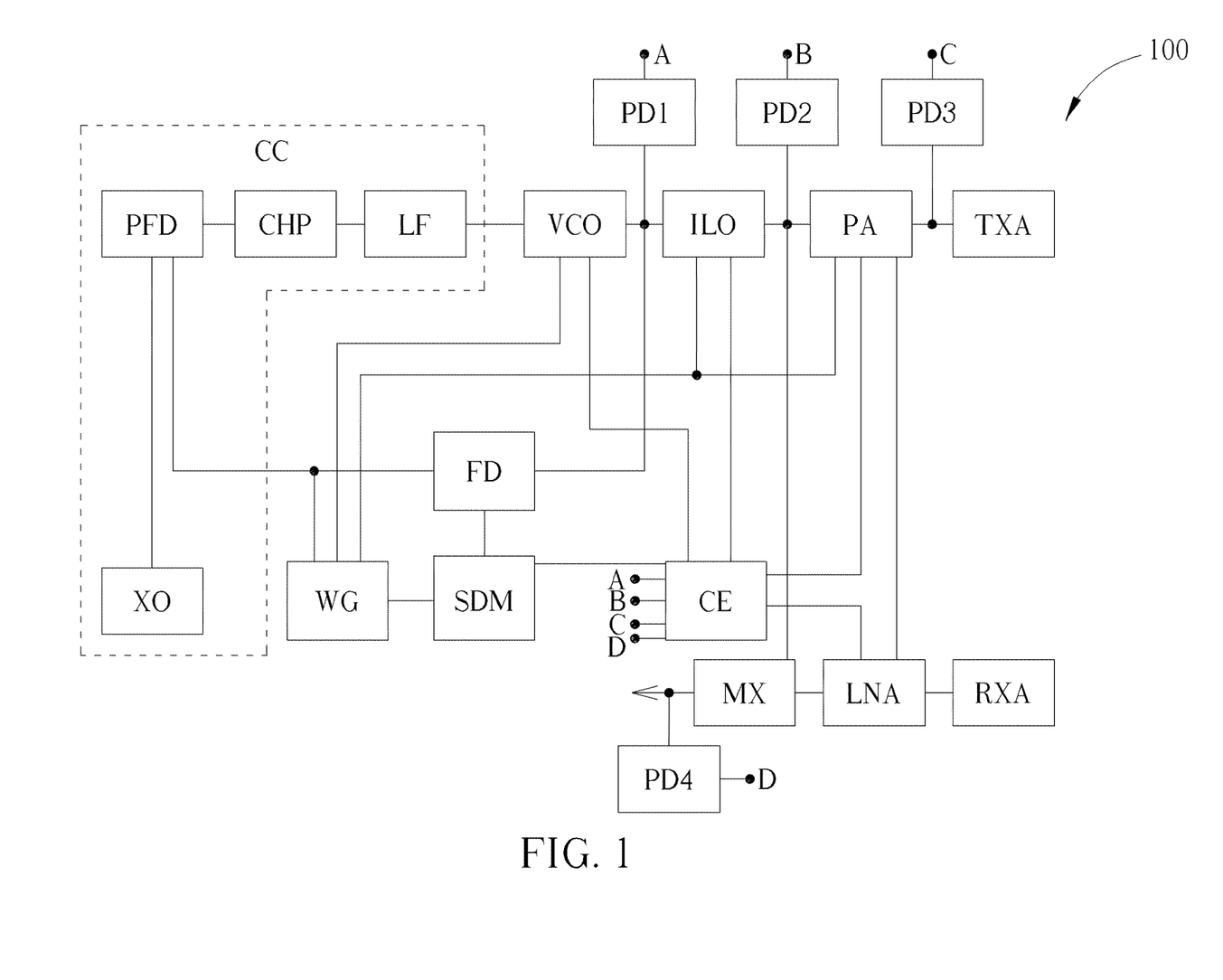
FIG. 1 is a block diagram of a frequency-modulated continuous-wave radar system according to an embodiment of the present invention.

FIG. 1 is a block diagram of a frequency-modulated continuous-wave radar system 100 according to an embodiment of the present invention. For simplicity, the frequency-modulated continuous-wave radar system 100 is called as an FMCW radar system 100 hereafter. The FMCW radar system 100 includes a waveform generator WG, a delta-sigma modulation circuit SDM, a voltage controlled oscillator VCO, a frequency divider circuit FD, a control circuit CC, an injection locked oscillator ILO, a power amplifier circuit PA, a first power detection circuit PD1, a second power detection circuit PD2, a third power detection circuit PD3, a transmitter antenna TXA, a receiver antenna RXA, a low noise amplifier LNA, a mixer MX, a fourth power detector circuit PD4, and a calibration engine circuit CE. The waveform generator WG is used for generating a modulation pattern signal. Here, the "modulation" is defined as a frequency modulation so that the modulation pattern signal can be regarded as a deterministic signal with a varied modulated frequency. The delta-sigma modulation circuit SDM is coupled to the waveform generator WG for modulating the modulation pattern signal in order to output a delta-sigma modulation signal. The delta-sigma modulation circuit SDM can use a MASH 1-1-1 circuit structure for generating the delta-sigma modulation signal. The voltage controlled oscillator VCO is coupled to the waveform generator WG for outputting a first frequency signal. The first frequency signal has a first frequency between 11.4 GHz and 13.4 GHz. However, the delta-sigma modulation circuit SDM is not limited to use the MASH 1-1-1 circuit. Further, the first frequency of the FMCW radar system 100 is not limited to a range between 11.4 GHz and 13.4 GHz. Any reasonable hardware modification and frequency adjustment falls into the scope of the present invention. The frequency divider circuit FD is coupled to the delta-sigma modulation circuit SDM and the voltage controlled oscillator VCO for converting the first frequency signal to a feedback low frequency signal according to the delta-sigma modulation signal. For example, the frequency divider circuit FD can use a high speed multi-modulus divider (MMD) for generating a varied divider ratio N in order to fractionalize N frequencies from the first frequency signal according to the delta-sigma modulation signal. Then, the first frequency signal can be converted to the feedback low frequency signal. N is a positive integer. After performing a frequency division process with varied divider ratio N, the first frequency signal with a varied frequency can be converted to the feedback low frequency signal with a stabled low frequency, such as around 40 MHz. The control circuit CC is coupled to the voltage controlled oscillator VCO and the frequency divider circuit FD for controlling linearity of the voltage controlled oscillator VCO according to the feedback low frequency signal. The injection locked oscillator ILO is coupled to the voltage controlled oscillator VCO and the waveform generator WG for converting the first frequency signal to a second frequency signal according to the modulation pattern signal. For example, the injection locked oscillator ILO can increase five times more frequency of the first frequency signal. Therefore, the second frequency signal generated by the injection locked oscillator ILO has a second frequency between 57 GHz and 67 GHz.

The power amplifier circuit PA is coupled to the injection locked oscillator ILO and the waveform generator WG for amplifying the second frequency signal in order to generate a radio frequency signal according to the modulation pattern signal. The first power detection circuit PD1 is coupled to the voltage controlled oscillator VCO for detecting a peak power of the first frequency signal. The second power detection circuit PD2 is coupled to the injection locked oscillator ILO for detecting a peak power of the second frequency signal. The third power detection circuit PD3 is coupled to the power amplifier circuit PA for detecting a peak power of the radio frequency signal. The transmitter antenna TXA is coupled to the power amplifier circuit PA for emitting the radio frequency signal to a wireless environment. Further, the receiver antenna RXA is used for receiving the radio frequency signal from the wireless environment. The low noise amplifier circuit LNA is coupled to the receiver antenna RXA for amplifying the radio frequency signal with low noise enhancement. The mixer MX is coupled to the low noise amplifier circuit LNA and the injection locked oscillator ILO for generating an intermediate frequency (IF) signal according to the radio frequency signal. The fourth power detection circuit PD4 is coupled to the mixer MX for detecting a peak power of the IF signal. Further, the FMCW radar system 100 includes a calibration engine circuit CE. The calibration engine circuit CE is coupled to the delta-sigma modulation circuit SDM, the voltage controlled oscillator VCO, the injection locked oscillator ILO, the power amplifier circuit PA, the first power detection circuit PD1, the second power detection circuit PD2, the third power detection circuit PD3, the fourth power detection circuit PD4, and the low noise amplifier circuit LNA for adjusting frequency gains of the voltage controlled oscillator VCO, the injection locked oscillator ILO, the power amplifier circuit PA, and the low noise amplifier circuit LNA to approach wideband flatness frequency responses according to peak powers of the first frequency signal, the second frequency signal, the radio frequency signal, and the intermediate frequency signal.

In the FMCW radar system 100, some hardware circuits can be reasonable modified. For example, the injection locked oscillator ILO can be omitted. When the injection locked oscillator ILO is omitted, the output signal of the voltage controlled oscillator VCO (i.e., the first frequency signal) can be directly received by the power amplifier circuit PA. Any reasonable hardware modification falls into the scope of the present invention.

In the FMCW radar system 100, the first power detection circuit PD1, the second power detection circuit PD2, the third power detection circuit PD3, the fourth power detection circuit PD4 can be used for detecting a peak voltage. However, the FMCW radar system 100 is not limited to use "power detection circuit" for detecting the peak voltage. For example, voltage peak detection circuits, envelope detector circuits, signal amplitude detector circuits can be introduced for detecting the peak voltage.

Figure 2:
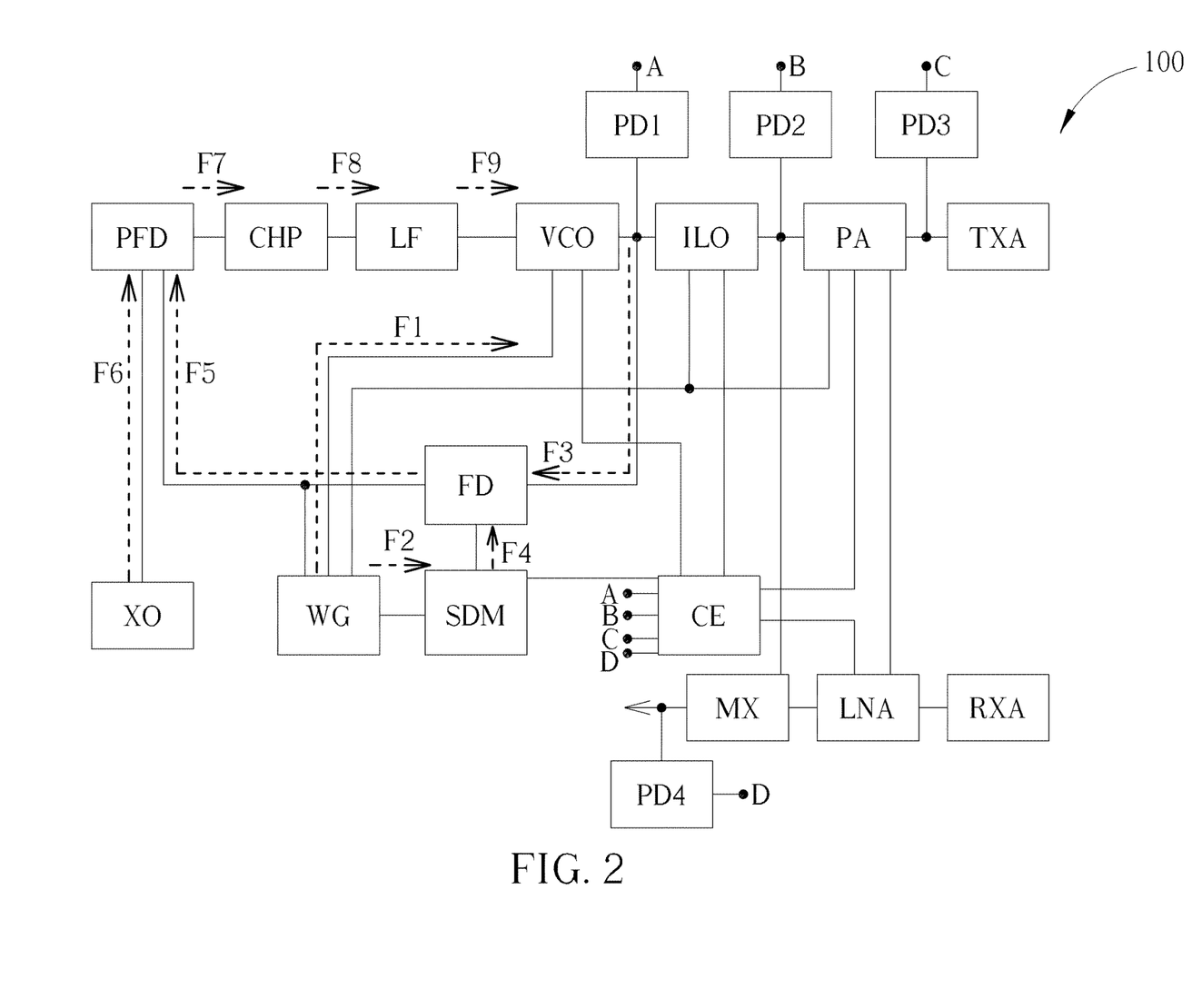
FIG. 2 is an illustration of signal flows of a two-point modulation path-based phase locked loop of the frequency-modulated continuous-wave radar system in FIG. 1.

FIG. 2 is an illustration of signal flows of a two-point modulation path-based phase locked loop of the FMCW radar system 100. In the embodiment, the phase locked loop capable of performing two-point modulation path can be applied to the FMCW radar system 100 for providing satisfactory linearity and a precise frequency lock function of the voltage controlled oscillator VCO. The phase locked loop can be formed by the control circuit CC, the voltage controlled oscillator VCO, the frequency divider circuit FD, the waveform generator WG, and the delta-sigma modulation circuit SDM. The control circuit CC in FIG. 1 includes a crystal oscillator XO, a phase-frequency detector PFD, a charge pump CHP, and a loop filter LP. The crystal oscillator XO is used for generating a reference signal with a fixed frequency (i.e., 40 MHz). The phase-frequency detector PFD is coupled to the crystal oscillator OX and the frequency divider circuit FD for detecting a phase offset and/or a frequency offset between the feedback low frequency signal and the reference signal. For example, when the feedback low frequency signal leads the reference signal, the phase-frequency detector PFD outputs a first detection signal. When the reference signal leads the feedback low frequency signal, the phase-frequency detector PFD outputs a second detection signal. In the embodiment, the first detection signal can be a voltage pulling high signal. The second detection signal can be a voltage pulling low signal. However, the first detection signal can also be the voltage pulling low signal. The second detection signal can also be the voltage pulling high signal. The charge pump CHP is coupled to the phase-frequency detector PFD for generating a control signal according to the first detection signal and the second detection signal. The loop filter LF is coupled to the charge pump CHP and the voltage controlled oscillator VCO for reducing a high frequency noise interference from the control signal in order to control the linearity of the voltage controlled oscillator VCO. Operations of the phase locked loop of the FMCW radar system 100 are illustrated below.

First, the waveform generator WG generates the modulation pattern signal to the voltage controlled oscillator VCO through a signal flow F1. The modulation pattern signal is also transmitted to the delta-sigma modulation circuit SDM through a signal flow F2. The voltage controlled oscillator VCO can generate the first frequency signal. Then, the first frequency signal can be received by the frequency divider circuit FD through a signal flow F3. Particularly, the frequency divider circuit FD can also receive the delta-sigma modulation signal from the delta-sigma modulation circuit SDM through a signal flow F4 and then converts the first frequency signal to the feedback low frequency signal according to the delta-sigma modulation signal by using a varied divider ratio N. Then, the feedback low frequency signal can be transmitted from the frequency divider circuit FD to the phase-frequency detector PFD through a signal flow F5. Here, the crystal oscillator XO can generate the reference signal to the phase-frequency detector PFD through a signal flow F6. After the phase-frequency detector PFD receives the feedback low frequency signal and the reference signal, the phase-frequency detector PFD can detect a phase offset and/or a frequency offset between the feedback low frequency signal and the reference signal. Then, the phase-frequency detector PFD can output a detection signal (i.e., a voltage pulling high or a voltage pulling low signal) accordingly. Then, the charge pump CHP can receive the detection signal bearing information of pulling high or pulling low through a signal flow F7 and generate a control signal accordingly. The control signal can be transmitted to the loop filter LF through a signal flow F8 for reducing high frequency noise. After the high frequency noise of the control signal is reduced by the loop filter LF, the control signal can be transmitted to the voltage controlled oscillator VCO through a signal flow F9. In the FMCW radar system 100, since the frequency divider circuit FD is introduced for dynamically converting the frequency of the first frequency signal to approach the frequency of the reference signal (i.e., around 40 MHz), voltage fluctuation of the control signal can be converged. Therefore, the operation linearity of the control oscillator VCO can be maintained when the control oscillator VCO outputs the first frequency signal with any frequency. Therefore, the FMCW radar system 100 can use the phase locked loop for generating signals with various frequencies from the control oscillator VCO under a stable operation linear region, leading to satisfactory signal generation performance.

Figure 3:
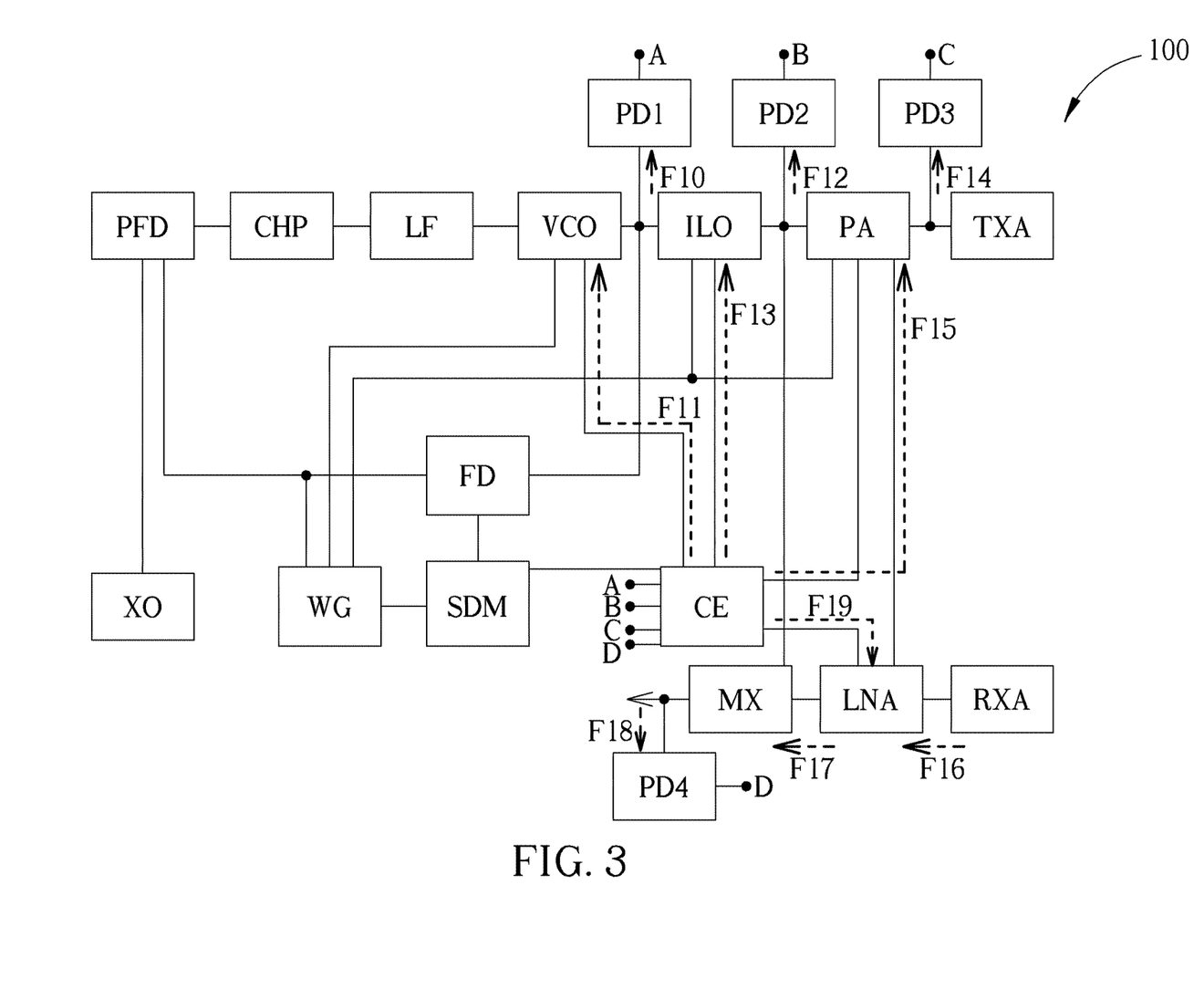
FIG. 3 is an illustration of signal flows for calibrating frequency gains of a voltage controlled oscillator, an injection locked oscillator, a power amplifier circuit, and a low noise amplifier of the frequency-modulated continuous-wave radar system in FIG. 1.

FIG. 3 is an illustration of signal flows for calibrating frequency gains of the voltage controlled oscillator VCO, the injection locked oscillator ILO, the power amplifier circuit PA, and the low noise amplifier LNA of the FMCW radar system 100. As previously mentioned, after the voltage controlled oscillator VCO generates the first frequency signal, the first power detection circuit PD1 can be used for buffering the first frequency signal through a signal flow F10 in order to detect a peak power of the first frequency signal at a certain frequency (i.e., 11.4 GHz). Then, the calibration engine circuit CE can control the voltage controlled oscillator VCO for compensating frequency gains to approach the wideband flatness frequency responses through a signal flow F11 when the peak power of the first frequency signal at the certain frequency (especially within a narrow band side lobe spectrum) is degraded. The injection locked oscillator ILO can convert the first frequency signal to the second frequency signal. After the injection locked oscillator ILO generates the second frequency signal, the second power detection circuit PD2 can be used for buffering the second frequency signal through a signal flow F12 in order to detect a peak power of the second frequency signal at a certain frequency (i.e., 57 GHz). Then, the calibration engine circuit CE can control the injection locked oscillator ILO for compensating frequency gains to approach the wideband flatness frequency responses through a signal flow F13 when the peak power of the second frequency signal at the certain frequency (especially within a narrow band side lobe spectrum) is degraded. The power amplifier circuit PA can amplify the second frequency signal for generating the radio frequency signal. After the power amplifier circuit PA generates the radio frequency signal, the third power detection circuit PD3 can be used for buffering the radio frequency signal through a signal flow F14 in order to detect a peak power of the radio frequency signal at the certain frequency. Then, the calibration engine circuit CE can control the amplifier circuit PA for compensating frequency gains to approach the wideband flatness frequency responses through a signal flow F15 when the peak power of the radio frequency signal at the certain frequency (especially within a narrow band side lobe spectrum) is degraded.

Similarly, in the receiver, after the radio frequency signal is received by the low noise amplifier circuit LNA through a signal flow F16, the radio frequency signal amplified by the low noise amplifier circuit LNA can be transmitted to the mixer MX through a signal flow F17 for generating the IF signal. The fourth power detection circuit PD4 can be used for detecting the peak power of the IF signal through a signal flow F18. Then, the calibration engine circuit CE can control the low noise amplifier circuit LNA for compensating frequency gains to approach the wideband flatness frequency responses through a signal flow F19 when the peak power of the IF signal at the certain frequency (especially within a narrow band side lobe spectrum) is degraded. Therefore, by adjusting frequency gains of the voltage controlled oscillator VCO, the injection locked oscillator ILO, the power amplifier circuit PA, and the low noise amplifier circuit LNA, equivalent frequency responses of the FMCW radar system 100 approach to the wideband flatness frequency responses without sacrificing power consumption and spectrum degradation.

Figure 4:
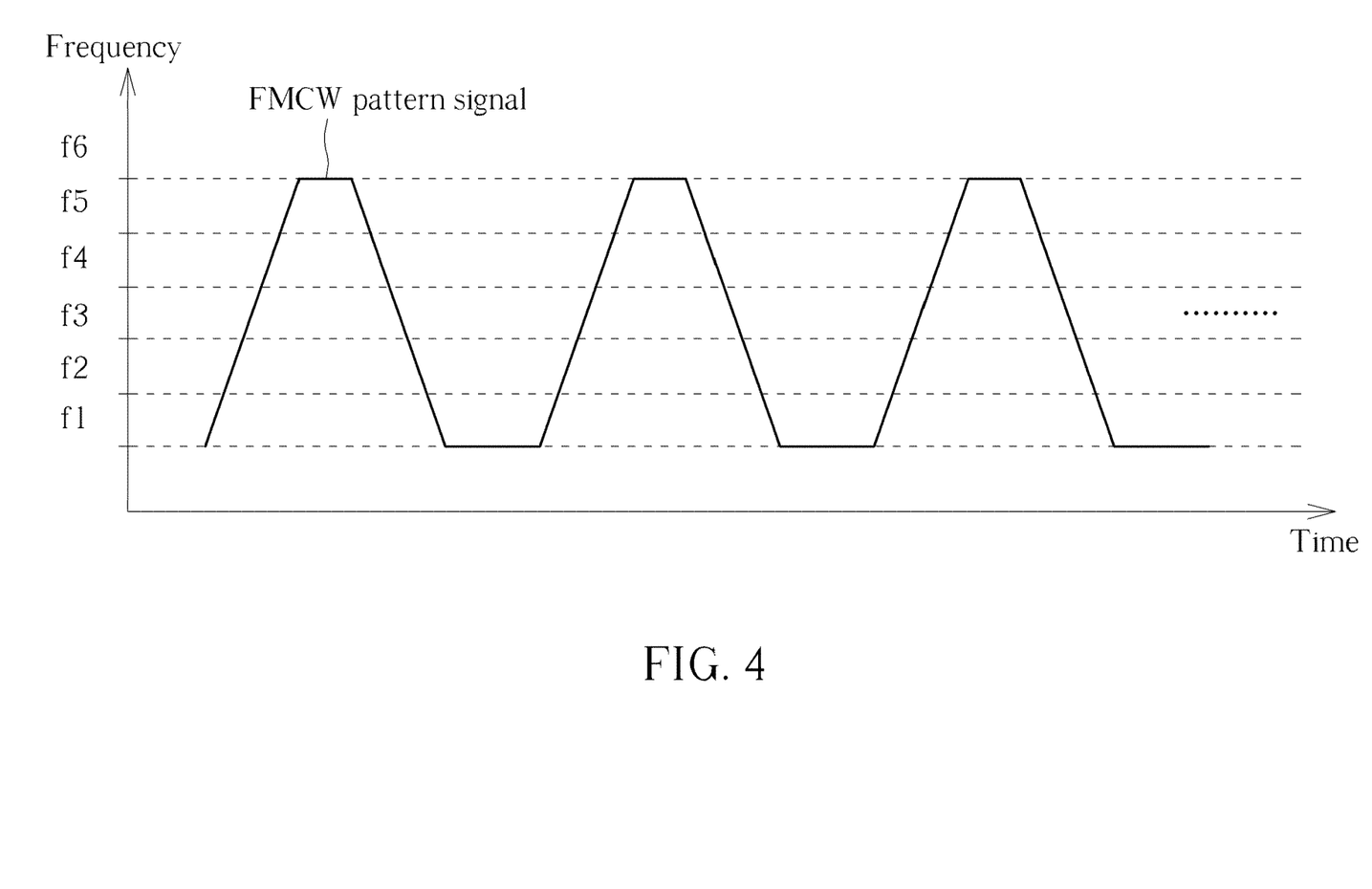
FIG. 4 is an illustration of a frequency-modulated continuous-wave pattern signal of the frequency-modulated continuous-wave radar system in FIG. 1.

FIG. 4 is an illustration of an FMCW pattern signal of the FMCW radar system 100. As previously mentioned, the FMCW radar system 100 can generate the radio frequency signal with the varied frequency over time. In other words, the radio frequency signal can include the FMCW pattern signal. For example, in FIG. 4, the FMCW pattern signal can be regarded as a deterministic frequency variation signal. X axis is denoted as a frequency scale. Y axis is denoted as a time scale. A frequency of the FMCW pattern signal is increased from an initial frequency of a frequency region f1 to a cap frequency of a frequency region f5. Then, the frequency of the FMCW pattern signal is decreased from the cap frequency of the frequency region f5 to the initial frequency of the frequency region f1. Specifically, the FMCW pattern signal is a frequency-periodic signal. In other words, the frequency of the FMCW pattern signal can be periodically varied over time. Therefore, since the FMCW radar system 100 is operated on wide band spectrum (i.e., 57-67 GHz), the FMCW radar system 100 is required to calibrate some deep fading frequency responses in the narrow band side lobe spectrum of each oscillator and amplifier. For example, in the FMCW radar system 100, each of the voltage controlled oscillator VCO, the injection locked oscillator ILO, the low noise amplifier circuit LNA, and the power amplifier circuit PA includes an inductive-capacitive tank circuit (LC tank circuit). The LC tank circuit can include at least one capacitor and an inductor coupled in parallel. The calibration engine circuit CE can control at least one capacitance of the LC tank circuit in order to fine tune resonated frequency of the LC tank circuit by tracking the modulation pattern signal. By doing so, the LC tank circuits of the voltage controlled oscillator VCO, the injection locked oscillator ILO, the low noise amplifier circuit LNA and the power amplifier circuit PA can be calibrated. The equivalent frequency responses of the FMCW radar system 100 can approach the wideband flatness frequency responses. Further, the FMCW pattern signal is not limited to a waveform illustrated in FIG. 4. For example, the FMCW pattern signal can be generated as a triangular wave, a saw-tooth wave, or any frequency modulated signal. Any reasonable modulated signal with varied frequency can be regarded as the FMCW pattern signal and thus falls into the scope of the present invention.

Figure 5:
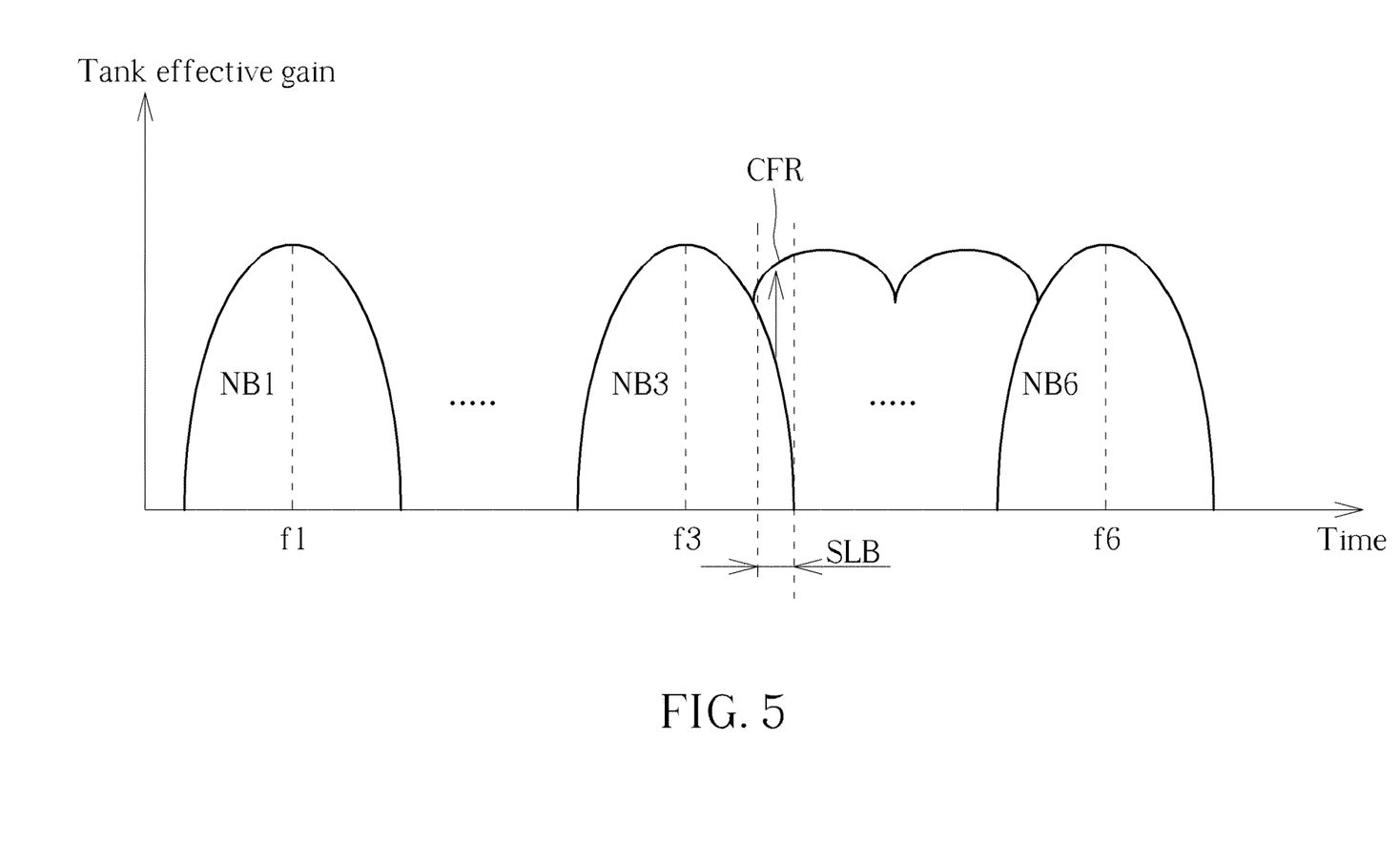
FIG. 5 is an illustration of calibrating frequency gains by compensating frequency gains when a peak power of a detected signal at narrow band side lobe frequencies is degraded in the frequency-modulated continuous-wave radar system in FIG. 1.

FIG. 5 is an illustration of calibrating frequency gains by compensating frequency gains when the peak power of a detected signal at narrow band side lobe frequencies is degraded in the FMCW radar system 100. As previously mentioned, the frequency gains are relevant to the tank effective gains of the voltage controlled oscillator VCO, the injection locked oscillator ILO, the low noise amplifier circuit LNA, and the power amplifier circuit PA. For example, the tank effective gains are generally designed as narrow band gains. In FIG. 5, tank effective gains of the narrow band frequency region f1 are denoted as NB1. Tank effective gains of the narrow band frequency region f3 are denoted as NB3. Tank effective gains of the narrow band frequency region f6 are denoted as NB6. Each narrow band frequency region has a main lobe frequency spectrum and a side lobe frequency spectrum. For example, the side lobe frequency spectrum of the narrow band frequency region f3 is denoted as SLB. When the tank effective gains are not calibrated, the FMCW pattern signal may suffer from severe gain degradation at a certain frequency, especially in the side lobe frequency spectrum. Therefore, the frequency gain calibration processes previously mentioned are required. For example, when the FMCW pattern signal is distorted at a frequency in the side lobe frequency spectrum of the narrow band frequency region f3, a peak power of the FMCW pattern signal is degraded at the frequency in the side lobe frequency spectrum. Then, the calibration engine circuit CE can be used for compensating frequency gains to approach the wideband flatness frequency responses CFR. The calibration engine circuit CE can use a lookup table for saving compensated frequency gains corresponding to all frequencies of the frequency regions f1 to f6. However, the FMCW radar system 100 is not limited to use the lookup table for accessing data of the compensated frequency gains. Any reasonable technology modification falls into the scope of the present invention.

Figure 6:
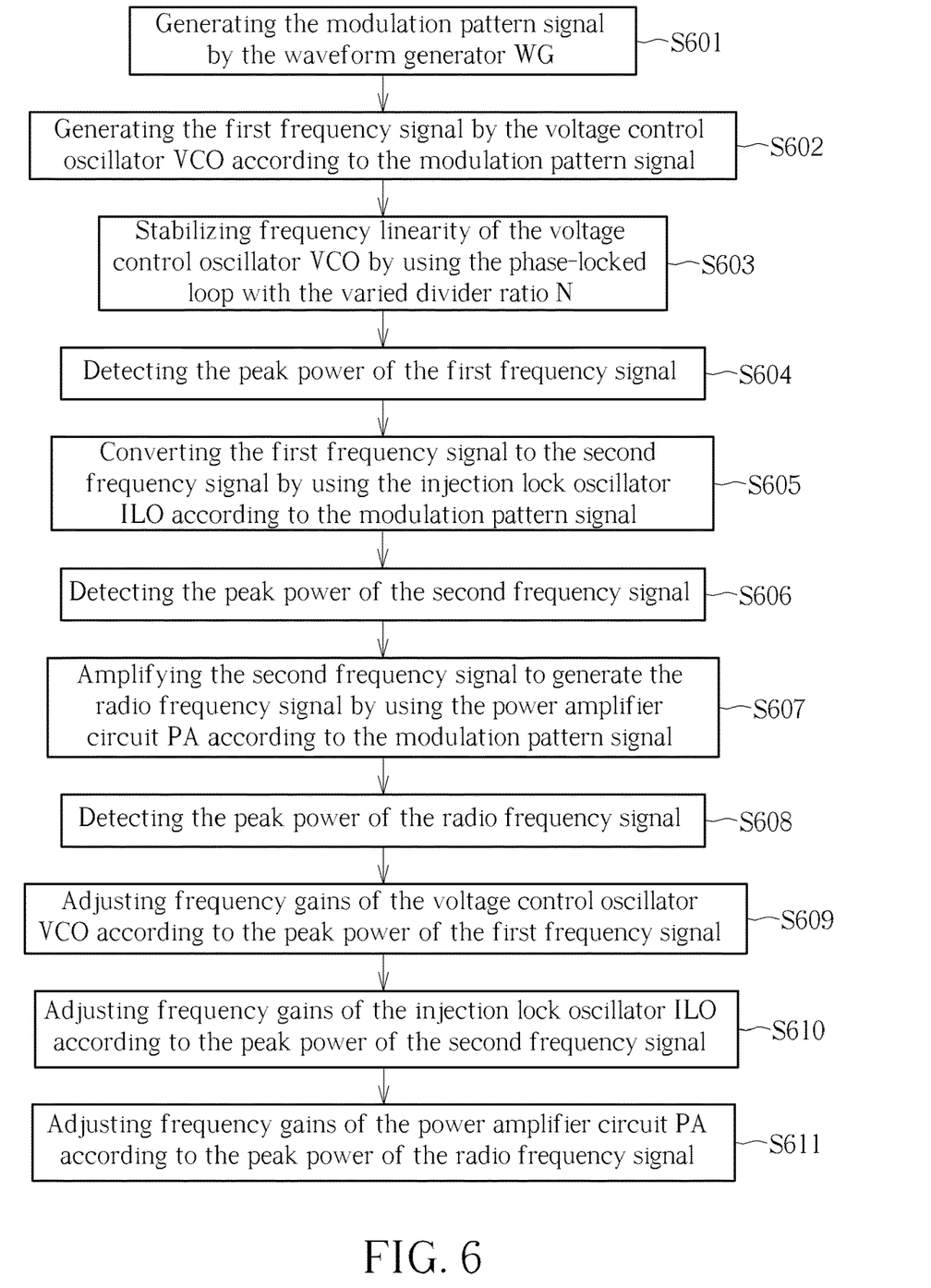
FIG. 6 is a flow chart of a frequency tracking method for calibrating frequency gains of a radio frequency signal to approach wideband flatness frequency responses by using the frequency-modulated continuous-wave radar system in FIG. 1.

FIG. 6 is a flow chart of a frequency tracking method for calibrating frequency gains of the radio frequency signal (including the FMCW pattern signal) to approach wideband flatness frequency responses by using the FMCW radar system 100. The frequency tracking method includes step S601 to step S611. Any reasonable step modification falls into the scope of the present invention. Step S601 to step S611 are illustrated below.

step S601: generating the modulation pattern signal by the waveform generator WG;

step S602: generating the first frequency signal by the voltage controlled oscillator VCO according to the modulation pattern signal;

step S603: stabilizing frequency linearity of the voltage controlled oscillator VCO by using the phase-locked loop with the varied divider ratio N;

step S604: detecting the peak power of the first frequency signal;

step S605: converting the first frequency signal to the second frequency signal by using the injection locked oscillator ILO according to the modulation pattern signal;

step S606: detecting the peak power of the second frequency signal;

step S607: amplifying the second frequency signal to generate the radio frequency signal by using the power amplifier circuit PA according to the modulation pattern signal;

step S608: detecting the peak power of the radio frequency signal;

step S609: adjusting frequency gains of the voltage controlled oscillator VCO according to the peak power of the first frequency signal;

step S610: adjusting frequency gains of the injection locked oscillator ILO according to the peak power of the second frequency signal;

step S611: adjusting frequency gains of the power amplifier circuit PA according to the peak power of the radio frequency signal.

Step S601 to step S611 are illustrated previously. Thus, illustrations of step S601 to step S611 are omitted here. In practice, step S601 to step S611 can be performed repeatedly for compensating all frequency gains to approach the wideband flatness frequency responses CFR. For example, the voltage controlled oscillator VCO can generate the first frequency signal with a first frequency equal to 11.4 GHz. The frequency calibration process can be performed by compensating frequency gain based on 11.4 GHz. Then, the voltage controlled oscillator VCO can generate the first frequency signal with a first frequency equal to 11.4+δ GHz. δ is an offset based on calibration resolution. The frequency calibration process can be performed by compensating frequency gain based on 11.4+δ GHz. Similarly, the voltage controlled oscillator VCO can generate the first frequency signal with a first frequency equal to 11.4+2δ GHz. The frequency calibration process can be performed by compensating frequency gain based on 11.4+2δ GHz, and so on. Therefore, all discrete frequency gains between 11.4 GHz and 13.4 GHz of the voltage controlled oscillator VCO (i.e., 11.4 GHz, 11.4+δ GHz, 11.4+2δ GHz, 11.4+3δ GHz, . . . , 13.4 GHz) can be calibrated to approach the wideband flatness frequency responses CFR. By using the frequency tracking method, the equivalent frequency responses of the FMCW radar system 100 can be calibrated to approach the wideband flatness frequency responses without sacrificing power consumption and spectrum degradation.

To sum up, the present invention discloses an FMCW radar system and a frequency tracking method. The FMCW radar system can perform the frequency tracking method for calibrating frequency gains of a radio frequency signal in wide spectrum. Therefore, the calibrated frequency gains approach wideband flatness frequency responses. In other words, conventional ultra-wide band FMCW requires wide bandwidth oscillators and amplifiers with high hardware complexity, high power consumption, and sacrificing spectrum degradation. In the FMCW radar system of the present invention, since the FMCW radar system can track a spectrum cap of each frequency bank, frequency gains can be compensated to approach wideband flatness frequency responses when a spectrum power is degraded. Thus, the FMCW radar system can provide satisfactory FMCW linearity and flatness of frequency gains without introducing high hardware complexity and high power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency-modulated continuous-wave radar system comprising:
   a waveform generator configured to generate a modulation pattern signal;
   a delta-sigma modulation circuit coupled to the waveform generator and configured to modulate the modulation pattern signal for outputting a delta-sigma modulation signal;
   a voltage controlled oscillator coupled to the waveform generator and configured to output a first frequency signal;
   a frequency divider circuit coupled to the delta-sigma modulation circuit and the voltage controlled oscillator and configured to convert the first frequency signal to a feedback low frequency signal according to the delta-sigma modulation signal;
   a control circuit coupled to the voltage controlled oscillator and the frequency divider circuit and configured to control linearity of the voltage controlled oscillator according to the feedback low frequency signal;
   an injection locked oscillator coupled to the voltage controlled oscillator and the waveform generator and configured to convert the first frequency signal to a second frequency signal according to the modulation pattern signal;
   a power amplifier circuit coupled to the injection locked oscillator and the waveform generator and configured to amplify the second frequency signal in order to generate a radio frequency signal according to the modulation pattern signal; and
   a first power detection circuit coupled to the voltage controlled oscillator and configured to detect a peak power of the first frequency signal;
   a second power detection circuit coupled to the injection locked oscillator and configured to detect a peak power of the second frequency signal;
   a third power detection circuit coupled to the power amplifier circuit and configured to detect a peak power of the radio frequency signal; and
   a calibration engine circuit coupled to the delta-sigma modulation circuit, the voltage controlled oscillator, the injection locked oscillator, the power amplifier circuit, the first power detection circuit, the second power detection circuit, and the third power detection circuit and configured to adjust frequency gains of the voltage controlled oscillator, the injection locked oscillator, and the power amplifier circuit to approach wideband flatness frequency responses according to peak powers of the first frequency signal, the second frequency signal, and the radio frequency signal;
   wherein the first frequency signal has a first frequency, the second frequency signal has a second frequency, and the second frequency is greater than the first frequency.

2. The system of claim 1, wherein the control circuit comprises:
   a crystal oscillator configured to generate a reference signal;
   a phase-frequency detector coupled to the crystal oscillator and the frequency divider circuit and configured to detect a phase offset and/or a frequency offset between the feedback low frequency signal and the reference signal;

wherein when the feedback low frequency signal leads the reference signal, the phase-frequency detector outputs a first detection signal, and when the reference signal leads the feedback low frequency signal, the phase-frequency detector outputs a second detection signal.

3. The system of claim 2, wherein the control circuit further comprises:
a charge pump coupled to the phase-frequency detector and configured to generate a control signal according to the first detection signal and the second detection signal; and
a loop filter coupled to the charge pump and the voltage controlled oscillator and configured to reduce high frequency noise interference from the control signal in order to control the linearity of the voltage controlled oscillator.

4. The system of claim 1, wherein the frequency divider circuit generates a varied divider ratio N for fractionalizing N frequencies from the first frequency signal according to the delta-sigma modulation signal in order to convert the first frequency signal to the feedback low frequency signal, and N is a positive integer.

5. The system of claim 1, wherein the first frequency is between 11.4 GHz and 13.4 GHz, the second frequency is between 57 GHz and 67 GHz, and the feedback low frequency signal has a frequency substantially equal to 40 MHz.

6. The system of claim 1, wherein the calibration engine circuit comprises:
a lookup table configured to save compensated frequency responses corresponding to all frequencies of the modulation pattern signal.

7. The system of claim 1, wherein the calibration engine circuit is configured to control the voltage controlled oscillator for compensating frequency gains to approach the wideband flatness frequency responses when the peak power of the first frequency signal at narrow band side lobe frequencies is degraded.

8. The system of claim 1, wherein the calibration engine circuit is configured to control the injection locked oscillator for compensating frequency gains to approach the wideband flatness frequency responses when the peak power of the second frequency signal at narrow band side lobe frequencies is degraded.

9. The system of claim 1, wherein the calibration engine circuit is configured to control the power amplifier circuit for compensating frequency gains to approach the wideband flatness frequency responses when the peak power of the radio frequency signal at narrow band side lobe frequencies is degraded.

10. The system of claim 1, further comprising:
a low noise amplifier circuit coupled to the calibration engine and configured to receive and amplify the radio frequency signal; and
a mixer coupled to the low noise amplifier circuit and the injection locked oscillator and configured to generate an intermediate frequency (IF) signal according to the radio frequency signal.

11. The system of claim 10, further comprising:
a fourth power detection circuit coupled to the mixer and the calibration engine circuit and configured to detect a peak power of an output signal of the mixer.

12. The system of claim 11, wherein the calibration engine circuit is configured to control the low noise amplifier circuit for compensating frequency gains to approach the wideband flatness frequency responses when the peak power of the output signal of the mixer at the frequency is degraded.

13. The system of claim 1, wherein each of the voltage controlled oscillator, the injection locked oscillator, and the power amplifier circuit comprises an inductive-capacitive tank circuit, and the inductive-capacitive tank circuit comprises at least one capacitor and an inductor coupled in parallel.

14. The system of claim 13, the calibration engine circuit is configured to control at least one capacitance of the inductive-capacitive tank in order to fine tune a resonated frequency of the inductive-capacitive tank by tracking the modulation pattern signal.

15. The system of claim 1, wherein the radio frequency signal comprises a frequency-modulated continuous-wave pattern, and a frequency of the frequency-modulated continuous-wave pattern is varied over time.

16. The system of claim 1, wherein the control circuit, the waveform generator, the delta-sigma modulation circuit, the frequency divider circuit, and the voltage controlled oscillator form a phase-locked loop circuit for stabilizing a frequency of the first frequency signal, and when the frequency of the first frequency signal is large, the frequency divider circuit generates a large divider ratio for fractionalizing a frequency band from the first frequency signal according to the delta-sigma modulation signal in order to convert the first frequency signal to the feedback low frequency signal.

17. A frequency tracking method for calibrating frequency gains of a radio frequency signal to approach wideband flatness frequency responses comprising:
generating a modulation pattern signal by a waveform generator;
generating a first frequency signal by a voltage controlled oscillator according to the modulation pattern signal;
stabilizing frequency linearity of the voltage controlled oscillator by using a phase-locked loop with a varied divider ratio N, wherein N a positive integer;
detecting a peak power of the first frequency signal;
converting the first frequency signal to a second frequency signal by using an injection locked oscillator according to the modulation pattern signal;
detecting a peak power of the second frequency signal;
amplifying the second frequency signal to generate a radio frequency signal by using a power amplifier circuit according to the modulation pattern signal;
detecting a peak power of the radio frequency signal;
adjusting frequency gains of the voltage controlled oscillator according to the peak power of the first frequency signal;
adjusting frequency gains of the injection locked oscillator according to the peak power of the second frequency signal; and
adjusting frequency gains of the power amplifier circuit according to the peak power of the radio frequency signal;
wherein the first frequency signal has a first frequency, the second frequency signal has a second frequency, and the second frequency is greater than the first frequency.

18. The method of claim 17, wherein adjusting frequency gains of the voltage controlled oscillator according to the peak power of the first frequency signal comprises:
compensating frequency gains of the voltage controlled oscillator to approach the wideband flatness frequency responses when the peak power of the first frequency signal at narrow band side lobe frequencies is degraded.

19. The method of claim 17, wherein adjusting frequency gains of the injection locked oscillator according to the peak power of the second frequency signal comprises:

compensating frequency gains of the injection locked oscillator to approach the wideband flatness frequency responses when the peak power of the second frequency signal at narrow band side lobe frequencies is degraded.

20. The method of claim 17, wherein adjusting frequency gains of the power amplifier circuit according to the peak power of the radio frequency signal comprises:

compensating frequency gains of the power amplifier circuit to approach the wideband flatness frequency responses when the peak power of the radio frequency signal at narrow band side lobe frequencies is degraded.

\* \* \* \* \*